(12) United States Patent
Otake et al.

(10) Patent No.: US 7,579,651 B2
(45) Date of Patent: Aug. 25, 2009

(54) SEMICONDUCTOR DEVICE

(75) Inventors: Seiji Otake, Saitama (JP); Shuichi Kikuchi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 216 days.

(21) Appl. No.: 11/393,530

(22) Filed: Mar. 29, 2006

(65) Prior Publication Data
US 2006/0220125 A1   Oct. 5, 2006

(30) Foreign Application Priority Data
Mar. 30, 2005   (JP) ............................. P2005-098969

(51) Int. Cl.
*H01L 29/94* (2006.01)
*H01L 29/78* (2006.01)
(52) U.S. Cl. .................. 257/335; 257/336; 257/337; 257/E21.632; 257/E21.644; 257/E21.696; 438/306; 438/525; 438/526
(58) Field of Classification Search ................. 257/335, 257/336, 337; 438/306, 525, 526
See application file for complete search history.

(56) References Cited

U.S. PATENT DOCUMENTS

| | | | | |
|---|---|---|---|---|
| 2002/0074612 A1* | 6/2002 | Bulucea et al. | ............. | 257/402 |
| 2003/0127689 A1* | 7/2003 | Hebert | ................. | 257/336 |
| 2006/0223259 A1 | 10/2006 | Otake et al. | | |

FOREIGN PATENT DOCUMENTS

| | | |
|---|---|---|
| JP | 04-103161 | 4/1992 |
| JP | 2001-250941 | 9/2001 |
| JP | 2002-083941 | 3/2002 |
| JP | 2003-158198 | 5/2003 |
| JP | 2004-104141 | 4/2004 |
| KR | 1995-0007345 | 3/1992 |
| KR | 2003-22086 | 3/2003 |
| KR | 10-385764 | 5/2003 |

* cited by examiner

*Primary Examiner*—Dao H Nguyen
(74) *Attorney, Agent, or Firm*—Fish & Richardson P.C.

(57) ABSTRACT

In a semiconductor device of the present invention, a thin gate oxide film is formed on a P-type diffusion layer. On the gate oxide film, a gate electrode is formed. N-type diffusion layers are formed in the P-type diffusion layer, and the N-type diffusion layer is used as a drain region. The N-type diffusion layer is diffused in a γ shape at least below the gate electrode. With the structure described above, a diffusion region of the N-type diffusion layer expands and comes to be a low-concentration region in the vicinity of a surface of an epitaxial layer. Thus, it is possible to reduce an electric field from the gate electrode and an electric field between a source and a drain.

7 Claims, 6 Drawing Sheets

SEMICONDUCTOR DEVICE

Priority is claimed to Japanese Patent Application Number JP2005-098969 filed on Mar. 30, 2005, the disclosure of which is incorporated herein by reference in its entirety.

BACKGROUND OF THE INVENTION

1. Field of the Invention

The present invention relates to a semiconductor device in which a thickness of a gate oxide film is reduced and an electric field in a drain region is also reduced.

2. Description of the Related Art

In a conventional semiconductor device, an N-type well region and a P-type well region are formed in a P-type silicon substrate. In the N-type well region, a P-channel MOS transistor is formed. In the P-type well region, an N-channel MOS transistor is formed. In this event, as to concentration profiles of the N-type well region and the P-type well region, optimum values thereof are determined by considering junction withstand voltages, junction capacities, short-channel effect suppression and the like of the MOS transistors. This technology is described for instance in Japanese Patent Application Publication No. 2004-104141 (Pages 8 to 9, FIG. 11).

In a conventional semiconductor device, by use of a self-alignment technique using a gate electrode as a mask, a source region and a drain region are formed in a P-type semiconductor substrate. On a channel region between the source and drain regions, a gate oxide film and the gate electrode are formed. Note that the drain region is formed in a DDD (Double Diffusion Drain) structure or in an LDD (Lightly Doped Drain) structure. Moreover, the gate oxide film is formed to be thick from an end of the gate electrode to an electric field maximum point in the drain region. There has been known a technology of improving reliability by reducing changes in MOSFET characteristics such as a shift in a threshold voltage value and deterioration of mutual conductance by use of the structure described above. This technology is described for instance in Japanese Patent Application Publication No. 2001-250941 (Pages 4 to 5, 7 pages, FIGS. 1 to 2).

As described above, in the conventional semiconductor device, the N-type well region and the P-type well region are formed in the P-type silicon substrate. Moreover, on the same substrate, the P-channel MOS transistor and the N-channel MOS transistor are formed. In the N-type well region and the P-type well region, the concentration profiles thereof are determined by considering the short-channel effect suppression and the like. Thus, in order to suppress the short-channel effect, it is required to keep impurity concentrations on surfaces of the well regions described above to be high within a desired range. In the case where the drain region is in a SD (Single Drain) structure or in the DDD structure by use of the structure described above, an impurity concentration of a drain diffusion layer is set low and diffusion cannot be expanded. Thus, there is a problem that it is difficult to achieve electric field relaxation in the drain region. Meanwhile, in the case where the drain region is in the LDD structure, an additional step is required, such as formation of a spacer insulating film on a sidewall of a gate electrode. As a result, there is a problem that the number of masks is increased and manufacturing costs are also increased.

Moreover, in the conventional semiconductor device, in order to form a CMOS transistor on the same substrate, a P-type well region is formed in an N-type well region. Moreover, in the N-type and P-type well regions, for the purpose of the short-channel effect suppression and the like, impurities are ion-implanted into the channel region. Thus, an impurity concentration in a surface region of a semiconductor layer is controlled. With the structure described above, an impurity concentration in a region in which the drain region is formed is relatively high, and diffusion of the drain region is hardly expanded either in a channel direction or in a depth direction. Thus, an electron current density in the drain region is increased, and an ON operation of a parasitic NPN transistor is easily performed. Consequently, there is a problem that withstand voltage characteristics in an ON operation of the semiconductor device are deteriorated.

Moreover, in the conventional semiconductor device, there is a tendency that a thickness of the gate oxide film is reduced or a channel length is shortened, in order to operate the device at a low drive voltage. Moreover, the structure described above induces the shift in the threshold voltage value and lowering of the mutual conductance by hot electron injection. As measures against the above problem, the gate oxide film in a region where characteristics are most affected by hot electrons is formed to be thicker than that in the other regions. However, in order to form the gate oxide film to be thick only in a desired region, dedicated etching and thermal oxidation steps are required. Thus, there is a problem that a manufacturing process is complicated and manufacturing costs are increased.

SUMMARY OF THE INVENTION

The present invention was made in consideration for the respective circumstances described above. The present invention provides a semiconductor device that includes a semiconductor layer, a drain region and a source region, which are formed in the semiconductor layer, a channel region positioned between the drain region and the source region, a back gate region in which the channel region is positioned, a gate oxide film formed on the semiconductor layer, and a gate electrode formed on the gate oxide film, wherein at least the drain region is formed in the back gate region, the drain region has a slope with respect to a surface of the semiconductor layer, and an angle formed by a tangent line of the slope and the surface of the semiconductor layer gets smaller toward the surface of the semiconductor layer. Therefore, in the present invention, the drain region positioned below the gate electrode is diffused wider toward the surface of the semiconductor layer. With the structure described above, an impurity concentration of the drain region in the vicinity of the surface of the semiconductor layer comes to be low, and electric field relaxation in the drain region is realized.

Moreover, in the semiconductor device of the present invention, a concentration gradient of the back gate region in which the drain region is formed has two inflection regions. Therefore, in the present invention, an impurity concentration of the back gate region gets lower toward the surface of the semiconductor layer. By use of the structure described above, the drain region is diffused more easily toward the surface of the semiconductor layer. Thus, withstand voltage characteristics in an ON operation of the semiconductor device can be improved.

Moreover, in the semiconductor device of the present invention, the drain region and the source region are formed in the back gate region, the source region has a slope with respect to the surface of the semiconductor layer, and an angle formed by a tangent line of the slope and the surface of the semiconductor layer gets smaller toward the surface of the semiconductor layer. Therefore, in the present invention, the drain and source regions positioned below the gate electrode are diffused wider toward the surface of the semiconductor layer. With the structure described above, a channel length can be shortened, and a current capacity can be improved.

Moreover, in the semiconductor device of the present invention, the drain region is a single drain structure or a DDD structure. Therefore, in the present invention, no spacer insulating film is formed on a sidewall of the gate electrode in a structure. With the structure described above, a step of forming the spacer insulating film can be omitted. Thus, manufacturing costs can be suppressed by reducing the number of masks and manufacturing steps.

Moreover, in the semiconductor device of the present invention, the gate oxide film has a thickness of 50 to 340 Å. Therefore, in the present invention, low voltage drive can be realized by reducing the thickness of the gate oxide film.

DESCRIPTION OF THE EMBODIMENTS

Figure 1:
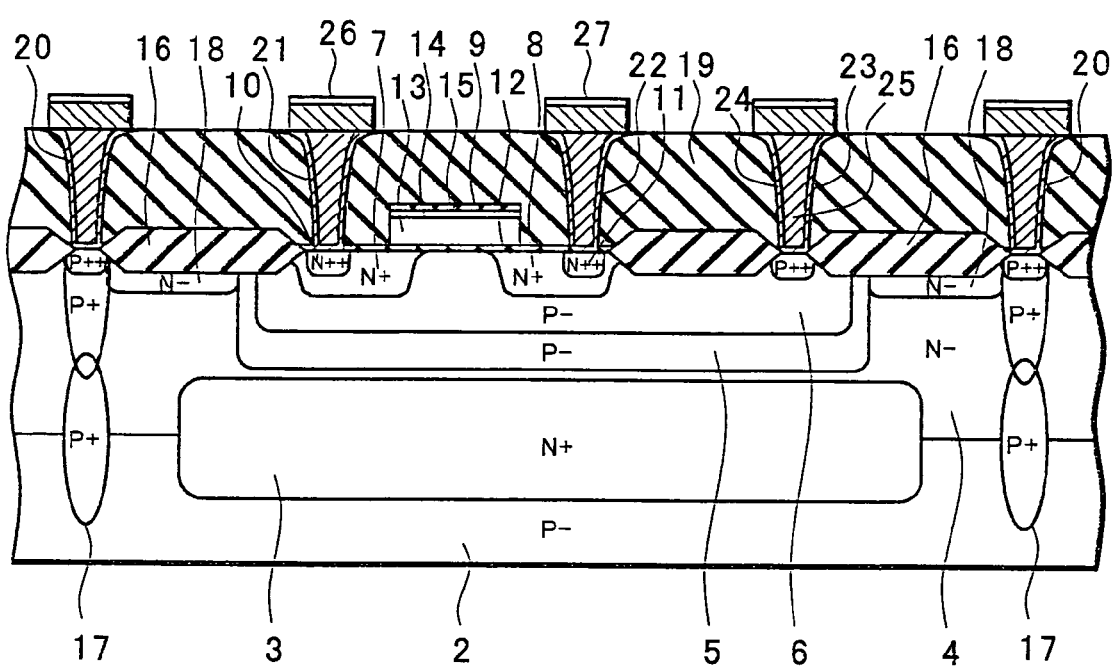
FIG. 1 is a cross-sectional view showing a semiconductor device in an embodiment of the present invention.
Figure 2A:
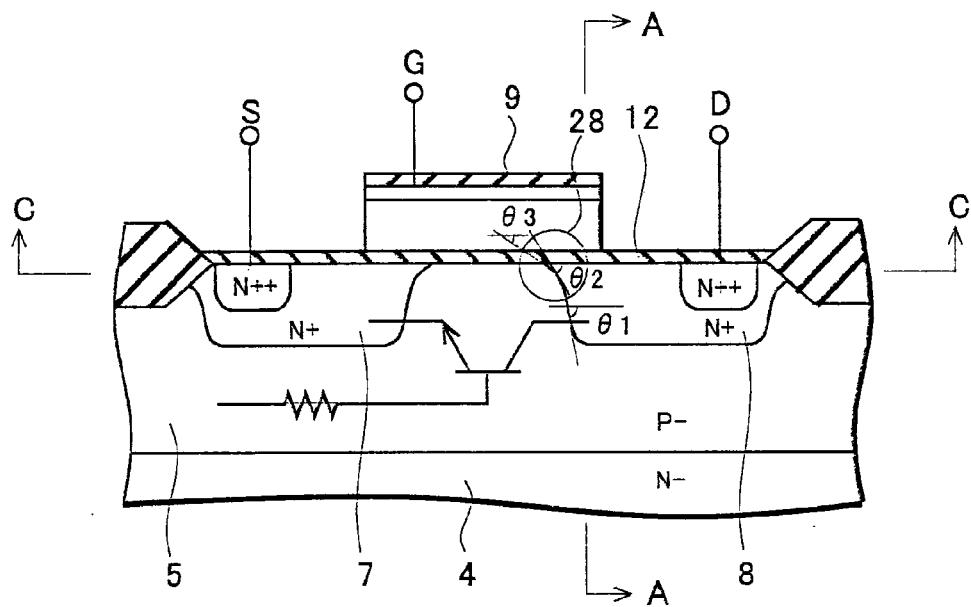
FIG. 2A is a cross-sectional view showing a drain region and a vicinity region thereof in the semiconductor device in the embodiment of the present invention.
Figure 2B:
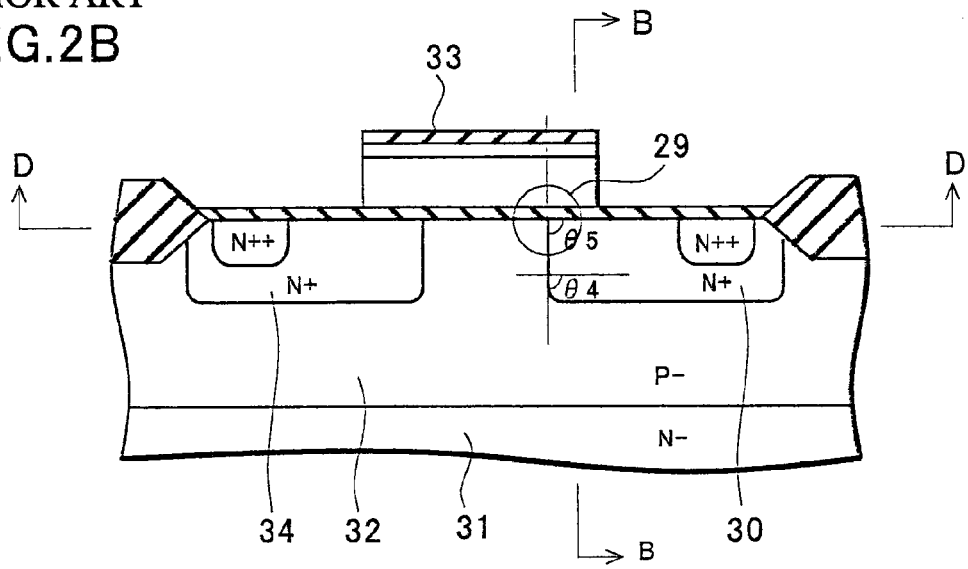
FIG. 2B is a cross-sectional view showing a drain region and a vicinity region thereof in a semiconductor device according to a conventional embodiment.
Figure 3A:
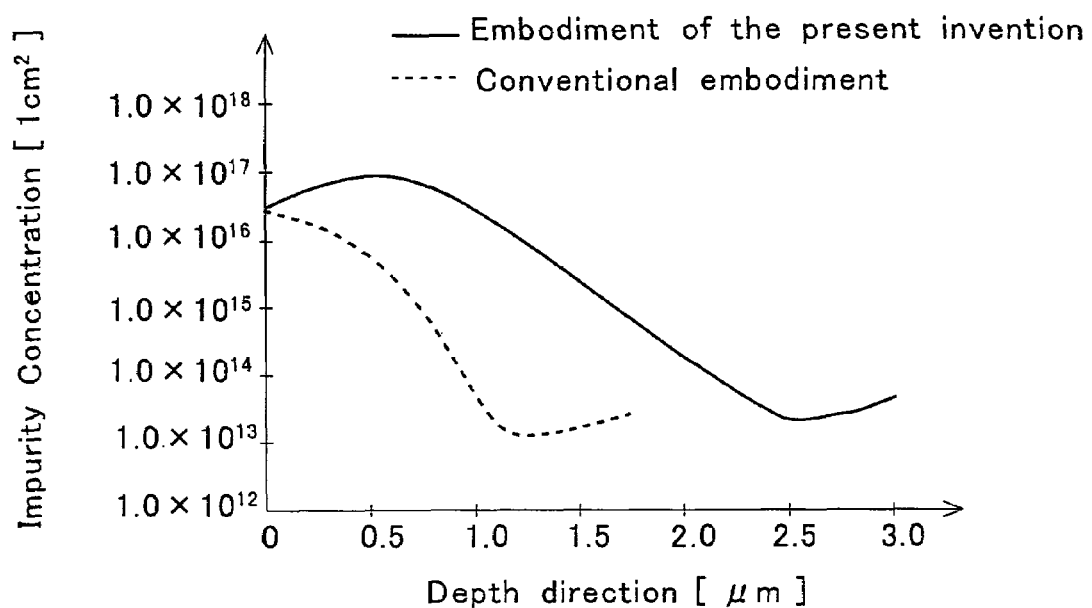
FIG. 3A is a graph showing concentration profiles of back gate regions in the semiconductor devices in the embodiment of the present invention and the conventional embodiment.
Figure 3B:
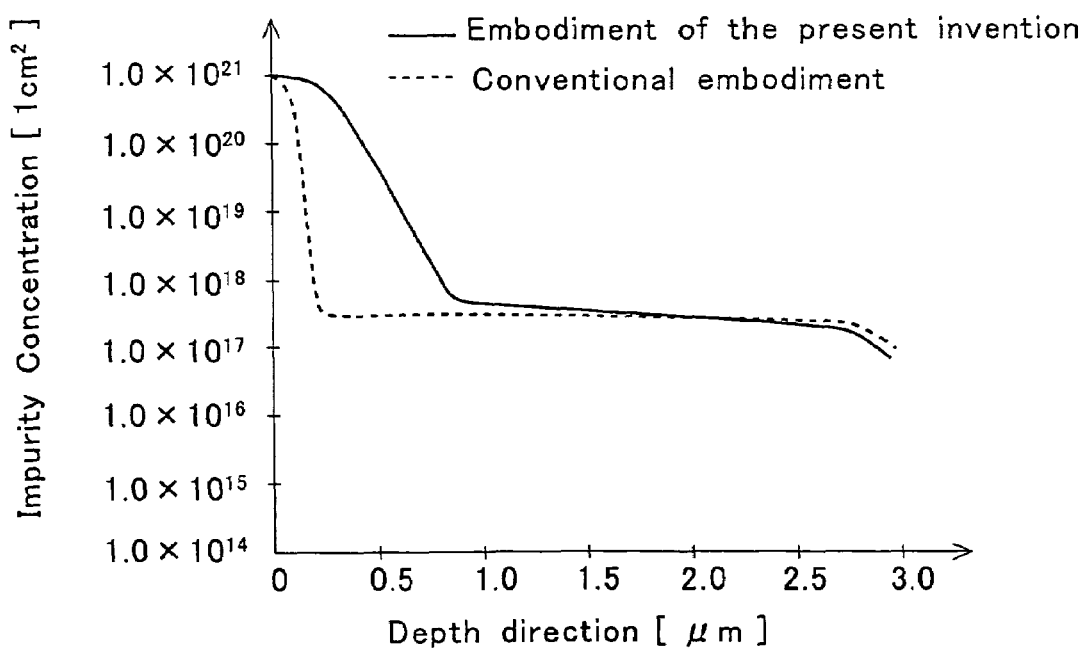
FIG. 3B is a graph showing concentration profiles of drain regions therein.
Figure 4:
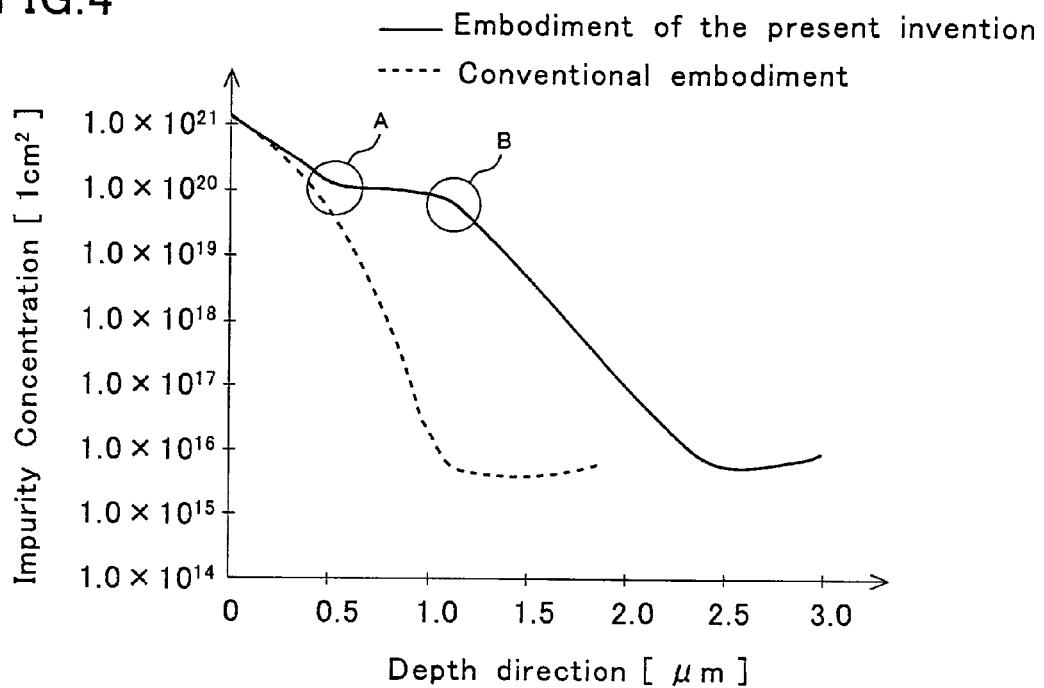
FIG. 4 is a graph related to the semiconductor devices in the embodiment of the present invention and the conventional embodiment, showing concentration profiles on cross sections along the lines A-A and B-B shown in FIGS. 2A and 2B.
Figure 5:
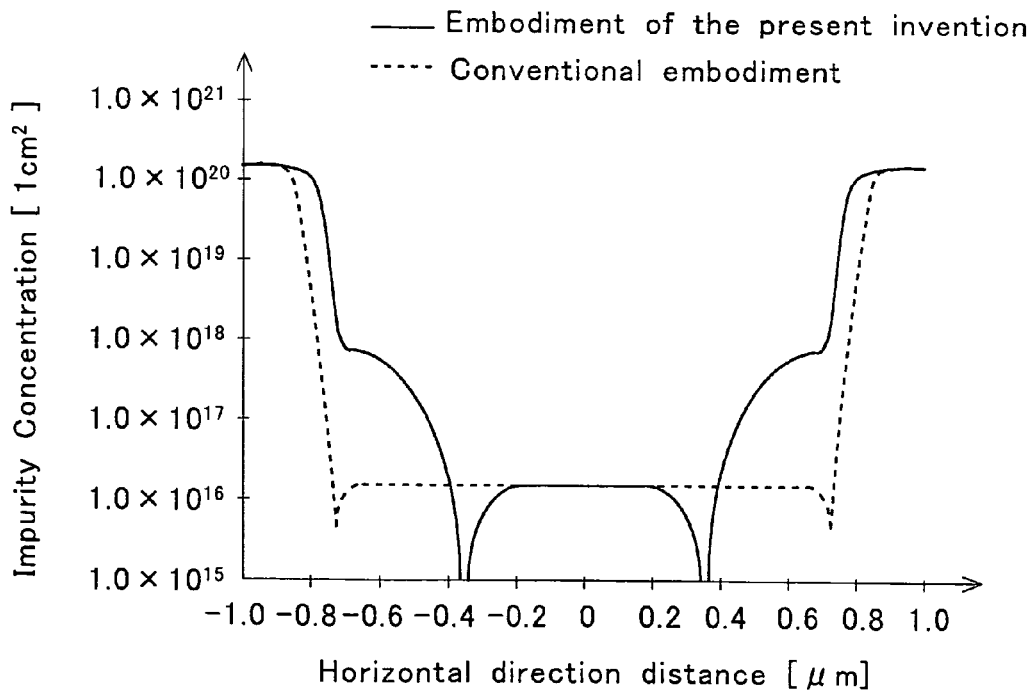
FIG. 5 is a graph related to the semiconductor devices in the embodiment of the present invention and the conventional embodiment, showing concentration profiles on cross sections along the lines C-C and D-D shown in FIGS. 2A and 2B.
Figure 6A:
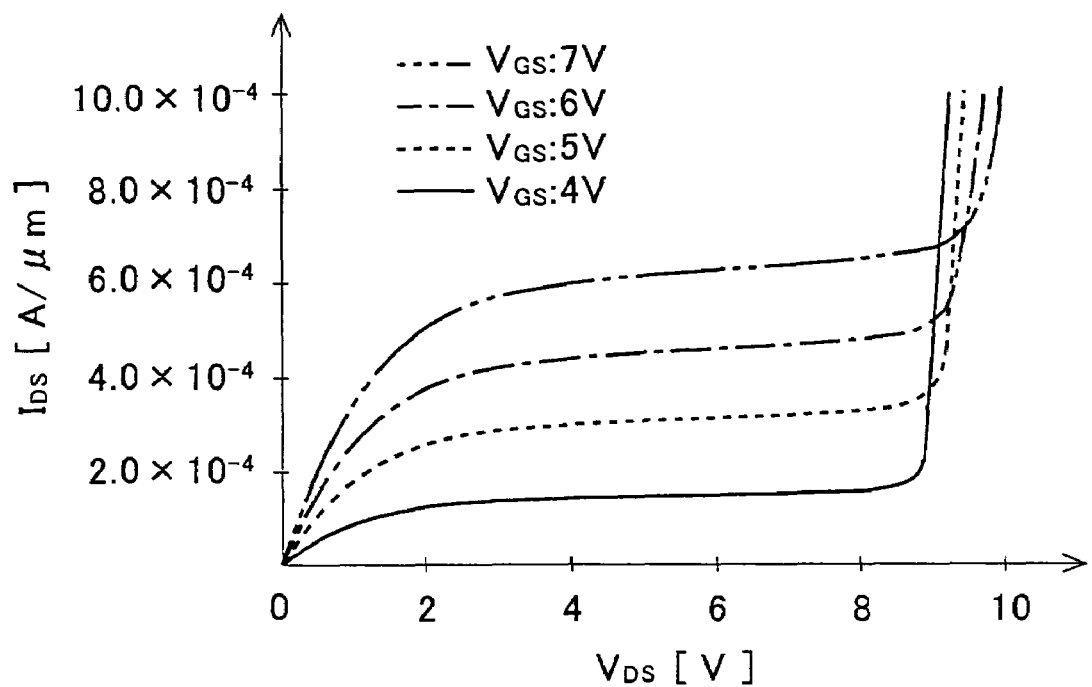
FIG. 6A is a graph showing a relationship of a current value between a drain and a source and withstand voltage characteristics in the semiconductor device in the embodiment of the present invention.
Figure 6B:
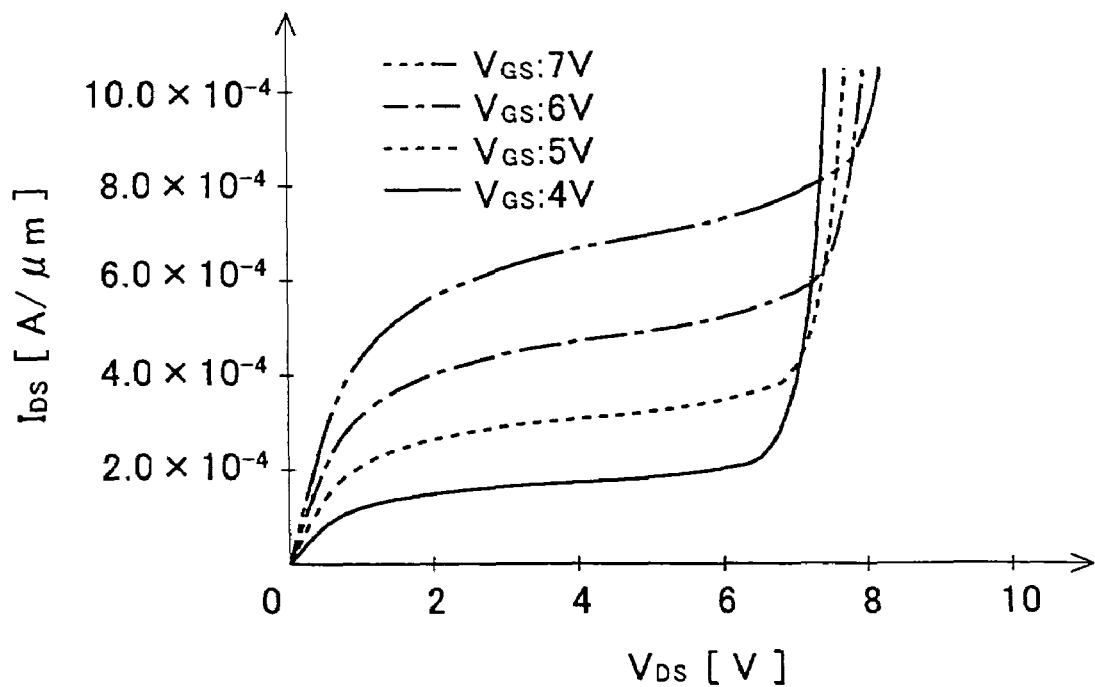
FIG. 6B is a graph showing a relationship of a current value between a drain and a source and withstand voltage characteristics in the semiconductor device according to the conventional embodiment.
Figure 7:
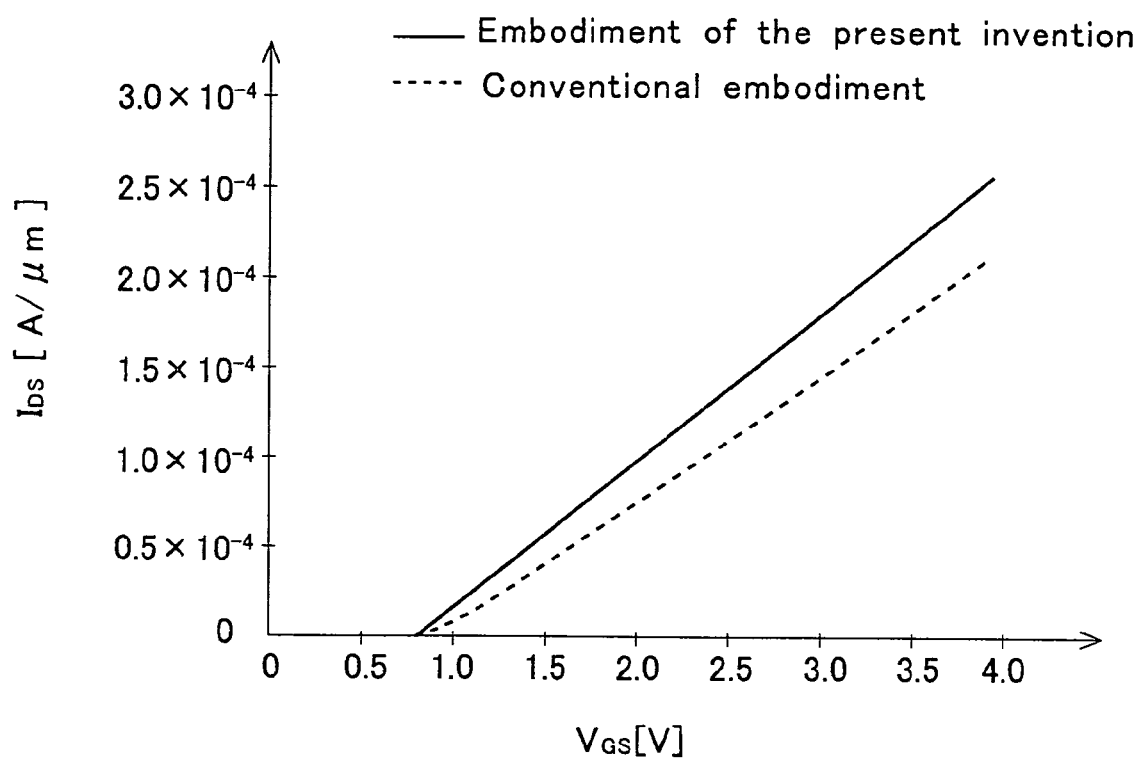
FIG. 7 is a graph showing current capacities in the embodiment of the present invention and the conventional embodiment.

With reference to FIGS. 1 to 7, a semiconductor device according to an embodiment of the present invention will be described in detail below. FIG. 1 is a cross-sectional view showing the semiconductor device of this embodiment. FIG. 2A is a cross-sectional view showing a drain region and a vicinity region thereof in the semiconductor device of this embodiment. FIG. 2B is a cross-sectional view showing a drain region and a vicinity region thereof in a conventional semiconductor device. FIG. 3A is a graph showing concentration profiles of back gate regions in the semiconductor device of this embodiment and the conventional semiconductor device. FIG. 3B is a graph showing concentration profiles of drain regions in the semiconductor device of this embodiment and the conventional semiconductor device. FIG. 4 is a graph showing concentration profiles on a cross section along the line A-A in the semiconductor device of this embodiment shown in FIG. 2A and on a cross section along the line B-B in the conventional semiconductor device shown in FIG. 2B. FIG. 5 is a graph showing concentration profiles on a cross section along the line C-C in the semiconductor device of this embodiment shown in FIG. 2A and on a cross section along the line D-D in the conventional semiconductor device shown in FIG. 2B. FIG. 6A is a graph showing withstand voltage characteristics of the semiconductor device of this embodiment. FIG. 6B is a graph showing withstand voltage characteristics of the conventional semiconductor device. FIG. 7 is a graph showing current capacities of the semiconductor device of this embodiment and the conventional semiconductor device.

As shown in FIG. 1, an N-channel MOS transistor 1 mainly includes a P-type single crystal silicon substrate 2, an N-type buried diffusion layer 3, an N-type epitaxial layer 4, P-type diffusion layers 5 and 6 to be used as a back gate region, an N-type diffusion layer 7 to be used as a source region, an N-type diffusion layer 8 to be used as a drain region, and a gate electrode 9.

The N-type epitaxial layer 4 is formed on the P-type single crystal silicon substrate 2. In the substrate 2 and the epitaxial layer 4, the N-type buried diffusion layer 3 is formed. Note that the substrate 2 and the epitaxial layer 4 in this embodiment correspond to "a semiconductor layer" of the present invention. Moreover, although description is given of the case where one epitaxial layer 4 is formed on the substrate 2 in this embodiment, the embodiment of the present invention is not limited to this case. For example, as "the semiconductor layer" of the present invention, only a substrate may be used or a plurality of epitaxial layers may be laminated on the substrate. Moreover, the substrate may be an N-type single crystal silicon substrate or a compound semiconductor substrate.

The P-type diffusion layer 5 is formed in the epitaxial layer 4. In the P-type diffusion layer 5, the P-type diffusion layer 6 is formed so as to overlap with a formation region of the diffusion layer 5. The P-type diffusion layers 5 and 6 are used as the back gate region. Note that the P-type diffusion layers 5 and 6 are formed while overlapping with each other, which will be hereinafter described as the P-type diffusion layer 5.

The N-type diffusion layers 7 and 8 are formed in the P-type diffusion layer 5. The N-type diffusion layer 7 is used as the source region. The N-type diffusion layer 8 is used as the drain region. An N-type diffusion layer 10 is formed in the N-type diffusion layer 7, and an N-type diffusion layer 11 is formed in the N-type diffusion layer 8. By use of the structure described above, the drain region is set to have a DDD structure. Moreover, the P-type diffusion layer 5 positioned between the N-type diffusion layers 7 and 8 is used as a channel region. On the epitaxial layer 4, a gate oxide film 12 is formed to be above the channel region.

The gate electrode 9 is formed on the gate oxide film 12. The gate electrode 9 is formed of a polysilicon film 13 and a tungsten silicon film 14 so as to have a desired thickness. On the tungsten silicon film 14, a silicon oxide film 15 is formed.

A LOCOS (Local Oxidation of Silicon) oxide film 16 is formed in the epitaxial layer 4. A flat part of the LOCOS oxide film 16 has a thickness of, for example, about 3000 to 5000 Å. Below the LOCOS oxide film 16 between the P-type diffusion layer 5 and a P-type isolation region 17, an N-type diffusion layer 18 is formed. The N-type diffusion layer 18 prevents short-circuit between the P-type diffusion layer 5 and the P-type isolation region 17 due to inversion of a surface of the epitaxial layer 4.

An insulating layer 19 is formed on the epitaxial layer 4. The insulating layer 19 is formed of a BPSG (Boron Phospho Silicate Glass) film, a SOG (Spin On Glass) film and the like. Moreover, by use of a publicly-known photolithography technology, contact holes 20 to 23 are formed in the insulating layer 19 by dry etching using $CHF_3+O_2$ gas, for example.

The contact holes 20 to 23 are filled with a barrier metal film 24 and a tungsten (W) film 25. On a surface of the tungsten film 25, an aluminum copper (AlCu) film and a barrier metal film are selectively formed. Thus, a source electrode 26 and a drain electrode 27 are formed. Note that, although the cross-sectional view of FIG. 1 shows no wiring layer for the gate electrode 9, the gate electrode 9 is connected to the wiring layer in other regions.

As shown in FIG. 2A, in this embodiment, a diffusion region of the N-type diffusion layer 8 used as the drain region is expanded toward the surface of the epitaxial layer 4 from a deep part thereof. To be more specific, the N-type diffusion layer 8 is formed in such a manner that an angle $\theta$ formed by a line tangent to a side face of the N-type diffusion layer 8 and the surface of the epitaxial layer 4 gets smaller toward the surface of the epitaxial layer 4. As shown in FIG. 2A, the N-type diffusion layer 8 is formed in such a manner that the angle $\theta$ formed by the line tangent to the side face of the N-type diffusion layer 8 and the surface of the epitaxial layer 4 comes to be $\theta1>\theta2>\theta3$. Moreover, below the gate electrode 9, the N-type diffusion layer 8 is diffused toward the N-type diffusion layer 7 and converges on the surface of the epitaxial layer 4. Specifically, in the N-type diffusion layer 8 indicated by a circle 28, curvature thereof is changed and the N-type diffusion layer 8 is diffused in a γ shape. Note that, similarly, the N-type diffusion layer 7 used as the source region is also diffused in a γ shape.

As shown in FIG. 2B, in a conventional case, an N-type diffusion layer 30 indicated by a circle 29 is diffused so that substantially no change occurs in its curvature in a structure of an N-channel MOS transistor. To be more specific, an angle $\theta$ formed by a line tangent to the N-type diffusion layer 30 and a surface of an epitaxial layer 31 is approximately the same all the way up to the surface of the epitaxial layer 31. Conceivably, depending on manufacturing conditions such as diffusion time, the formed angle $\theta$ is slightly increased or reduced. For example, as to the angle formed by the line tangent to the N-type diffusion layer 30 and the surface of the epitaxial layer 31, the angle $\theta4$ nearly equals to the angle $\theta5$.

Next, with reference to FIGS. 3 and 4, description will be given of the reason why the structure shown in FIG. 2A is formed. In FIGS. 3 and 4, each solid line indicates a concentration profile of a back gate region in this embodiment. Meanwhile, each dotted line indicates a concentration profile of a conventional back gate region.

As shown in FIG. 3A, in the back gate region of this embodiment, the P-type diffusion layer 5 is formed in such a manner that an impurity concentration peak thereof exists in a region about 0.6 μm away from the surface of the epitaxial layer 4. This concentration profile is realized by injecting and diffusing impurities so that the impurity concentration peak of the P-type diffusion layer 5 comes to be in a part deeper than an impurity concentration peak of the P-type diffusion layer 6. Meanwhile, in the conventional back gate region, a P-type diffusion layer 32 is formed in such a manner that an impurity concentration peak thereof exists in the vicinity of the surface of the epitaxial layer 31.

As shown in FIG. 3B, in the drain region of this embodiment, the N-type diffusion layer 8 is formed in such a manner that an impurity concentration peak thereof exists in the vicinity of the surface of the epitaxial layer 4. Moreover, the drain region is formed down to the deep part of the epitaxial layer 4. Meanwhile, in a drain region of a conventional embodiment, similarly, the N-type diffusion layer 30 is formed in such a manner that an impurity concentration peak thereof exists in the vicinity of the surface of the epitaxial layer 31.

As shown in FIG. 4, the concentration profile on the cross section along the line A-A in this embodiment has two inflection regions as indicated by circles A and B in the back gate region. This is because the P-type diffusion layer 5 has the impurity concentration peak at the deep part, as described with reference to FIG. 3A. On the other hand, the concentration profile on the cross section along the line B-B in the conventional embodiment substantially has no inflection regions in the back gate region. Note that the cross section along the line A-A in this embodiment and the cross section along the line B-B in the conventional embodiment are cross sections of the same region in the case where the same element size is adopted.

Specifically, in this embodiment, the P-type diffusion layer 5 has the impurity concentration peak at the deep part, and the impurity concentration is gradually lowered toward the surface of the epitaxial layer 4. In the P-type diffusion layer 5 having the concentration profile described above, the N-type diffusion layer 8 is formed. Thus, the N-type diffusion layer 8 is diffused more easily toward the surface of the epitaxial layer 4 and is formed into the γ shape described above.

Next, with reference to FIG. 5, a concentration profile of the drain region will be described. Note that, in a horizontal axis, the gate electrode is set as a center, a distance toward the drain region is indicated as positive, and a distance toward the source region is indicated as negative. Moreover, the cross section along the line C-C in this embodiment and the cross section along the line D-D in the conventional embodiment are cross sections of the same region in the case where the same element size is adopted.

As shown in FIG. 5, in a concentration profile on the cross section along the line C-C in this embodiment, an impurity concentration of the N-type diffusion layers 7 and 8 is gradually increased from a region about 0.3 (μm) away from the center of the gate electrode 9 to a region about 0.7 (μm) away from the center thereof. Moreover, after the region about 0.7 (μm) away from the center of the gate electrode 9, the impurity concentration thereof is drastically increased. Meanwhile, in a concentration profile on the cross section along the line D-D in the conventional embodiment, an impurity concentration of the N-type diffusion layers 30 and 34 is drastically increased after a region about 0.7 (μm) away from a center of a gate electrode 33.

Specifically, the N-type diffusion layers 7 and 8 to be the source region or the drain region in this embodiment are formed to have a structure in which low-concentration diffusion regions are expanded to the center of the gate electrode 9 in the vicinity of the surface of the epitaxial layer 4. With the structure described above, although a vertical electric field from the gate electrode is increased by setting the gate oxide film 12 to have a thickness of, for example, 50 to 340 (Å), electric field relaxation can be achieved by the low-concentration region in the drain region. Moreover, a channel direction electric field from the source region toward the drain region is maximized at an end of the drain region. For the channel direction electric field, similarly, the electric field relaxation can be achieved by the low-concentration region in the drain region by use of the structure described above.

Lastly, with reference to FIGS. 6 and 7, description will be given of effects achieved by the structure having the concentration profiles described in FIGS. 3 to 5.

FIG. 6A shows withstand voltage characteristics in the structure of this embodiment shown in FIG. 2A. FIG. 6B shows withstand voltage characteristics in the conventional structure shown in FIG. 2B. As shown in FIG. 2A, along with an ON operation of the N-channel MOS transistor 1, a parasitic NPN transistor including the N-type diffusion layers 7 and 8 and the P-type diffusion layer 5 performs an ON operation.

Here, the ON operation of the parasitic NPN transistor is caused by the following two operations. First, a free carrier (hole) to be paired with a free carrier (electron) is generated in the N-type diffusion layer 8 by impact ionization caused by a high electric field in the vicinity of the drain region below the gate electrode 9. Thereafter, the free carrier (hole) flows into the P-type diffusion layer 5 to forward bias between an emitter and a base in the parasitic NPN transistor. Thus, the ON operation of the parasitic NPN transistor may be performed. Next, when the N-type diffusion layer 8 that is the drain region is formed of a shallow diffusion layer, an electron current density in the N-type diffusion layer 8 is increased to facilitate generation of the free carrier (hole). Thereafter, the free carrier (hole) generated in the N-type diffusion layer 8 flows into the P-type diffusion layer 5 to forward bias between the emitter and the base in the parasitic NPN transistor. Thus, the ON operation of the parasitic NPN transistor may be performed.

As described above, in this embodiment, the N-type diffusion layer 8 which is the drain region is diffused below the gate electrode 9, and the diffusion region thereof is a low-concentration region. In the ON operation of the MOS transistor, the electric field in the drain region is reduced, occurrence of the impact ionization is suppressed, and generation of the free carrier (hole) is suppressed. Moreover, the diffusion of the N-type diffusion layer 8 which is the drain region is set deep, and a passage of the free carrier (electron) is increased. Accordingly, in the ON operation of the MOS transistor, the electron current density in the N-type diffusion layer 8 is lowered, and the generation of the free carrier (hole) is suppressed. As a result, the ON operation of the parasitic NPN transistor is suppressed, and the withstand voltage characteristics in the ON operation of the MOS transistor are improved.

To be more specific, as shown in FIG. 6A, up to about 8 (V) can be used as a source-drain voltage in the structure of this embodiment. Moreover, although there is some difference depending on a magnitude of a gate-source voltage, when the source-drain voltage is within a range of about 2 (V) to about 8 (V), a slope is flat or close to flat. Thus, stable drive characteristics can be obtained.

Meanwhile, as shown in FIG. 6B, up to about 6 (V) can be used as a source-drain voltage in the structure of the conventional embodiment. However, compared with FIG. 6A, the withstand voltage characteristics are deteriorated by about 2 (V). Moreover, although there is some difference depending on a magnitude of a gate-source voltage, when the source-drain voltage is within a range of about 2 (V) to about 6 (V), a slope comes to be gentle. However, compared with FIG. 6A, the slope is not flat or close to flat. Thus, a hot carrier is easily generated, and it is difficult to obtain the stable drive characteristics.

As shown in FIG. 7, in the structure of this embodiment, a current capacity is improved compared with the structure of the conventional embodiment. This is because the N-type diffusion layers 7 and 8 to be the source and drain regions are diffused toward the center of the gate electrode 9 and the channel length is shortened, as described above with reference to FIG. 5. Specifically, particularly in the drain region to which a high voltage is applied, the N-type diffusion layer 8, which forms a PN junction region with the channel region, is a low-concentration diffusion region. Thus, a depletion layer can be expanded toward the drain region, and the current capacity can be improved while retaining desired withstand voltage characteristics.

Moreover, in this embodiment, by forming the drain region in the DDD structure, it is possible to omit the step of forming a spacer insulating film on a sidewall of the gate electrode. Thus, the number of masks can be reduced and the manufacturing costs can be cut. Moreover, the manufacturing process can also be simplified.

Note that, in this embodiment, the description was given of the case where the drain region is formed in the DDD structure. However, the embodiment of the present invention is not limited to the above case. For example, the drain region may be formed to have a single drain structure. Moreover, in this embodiment, the P-type diffusion layers 5 and 6 are formed when the back gate region is formed. However, the embodiment of the present invention is not limited to the above case. As long as a concentration profile which can realize a diffusion structure of the drain region in this embodiment is used, arbitrary design changes in a diffusion structure of the back gate region are possible. Besides the above, various changes can be made without departing from the scope of the embodiment of the present invention.

In the embodiment of present invention, the back gate region is formed so as to have a peak of the impurity concentration at a deep part. The drain region formed in the back gate region is diffused widely in the vicinity of the surface of the semiconductor layer. Moreover, the impurity concentration of the drain region is set low below the gate electrode. With the structure described above, a vertical electric field or a channel direction electric field from the gate electrode can be reduced in the drain region.

Moreover, in the embodiment of the present invention, the drain region is formed into a γ shape. Moreover, the drain region is deeply diffused. With the structure described above, it is possible to prevent an electron current density from being increased in the drain region. Thus, withstand voltage characteristics in an ON operation of the device can be improved by suppressing an ON operation of a parasitic NPN transistor.

Moreover, in the embodiment of the present invention, the drain and source regions are formed into a γ shape below the gate electrode. The region positioned below the gate electrode has a low impurity concentration. With the structure described above, the channel length is shortened, and the current capacity can be improved while retaining the withstand voltage characteristics.

Moreover, in the embodiment of the present invention, the drain region is formed in the DDD structure or in the single drain structure. With the structure described above, it is not required to form the spacer insulating layer on the sidewall of the gate electrode. Thus, the number of masks and the manufacturing steps can be reduced, and the manufacturing costs can be reduced. Moreover, the manufacturing process can also be simplified.

Moreover, in the embodiment of the present invention, the drain region is diffused in the γ shape below the gate electrode. Moreover, the drain region has a low impurity concentration below the gate electrode. With the structure described above, electric field relaxation can be achieved also in the drain region, and the thickness of the gate oxide film can be reduced. Thus, the low voltage drive can be realized.

What is claimed is:

1. A semiconductor device comprising:
a semiconductor layer;
a drain region and a source region, which are formed in the semiconductor layer;

a channel region positioned between the drain region and the source region;

a back gate region in which the channel region is positioned;

a gate oxide film formed on the semiconductor layer; and a gate electrode formed on the gate oxide film, wherein the drain region is formed in the back gate region and an impurity concentration of the back gate region near an upper surface of the back gate region is lower than an impurity concentration of an area of the back gate region that is further from the upper surface, the drain region has a peak impurity concentration, wherein a peak impurity concentration region of the drain region is closer to the upper surface of the back gate region than a peak impurity concentration region of the back gate region, the drain region has a slope with respect to a surface of the semiconductor layer, and an angle formed by a tangent line of the slope and the surface of the semiconductor layer adjacent to the gate oxide film is less than 90 degrees and continuously gets smaller toward the surface of the semiconductor layer.

2. The semiconductor device according to claim 1, wherein a concentration gradient of the back gate region in which the drain region is formed has two inflection regions.

3. The semiconductor device according to claim 1, wherein the drain region and the source region are formed in the back gate region, the source region has a slope with respect to the surface of the semiconductor layer, and an angle formed by a tangent line of the slope and the surface of the semiconductor layer gets smaller toward the surface of the semiconductor layer.

4. The semiconductor device according to claim 1, wherein the drain region is in any of a SD structure and a DDD structure.

5. The semiconductor device according to claim 1, wherein the gate oxide film has a thickness of 50 to 340 Å.

6. The semiconductor device according to claim 1, wherein the back gate region is formed from two overlapping diffusion layers and the drain region is formed in the overlapping region of the back gate region.

7. The semiconductor device according to claim 1, wherein the peak impurity concentration of the back gate region is between 0.6-0.8 μm from the upper surface of the back gate region.

* * * * *